United States Patent
Okada et al.

(10) Patent No.: US 9,680,285 B2
(45) Date of Patent: Jun. 13, 2017

(54) LASER LIGHT-SOURCE APPARATUS AND LASER PULSE LIGHT GENERATING METHOD

(71) Applicant: SPECTRONIX CORPORATION, Ibaraki-shi, Osaka (JP)

(72) Inventors: Joji Okada, Ibaraki (JP); Yosuke Orii, Ibaraki (JP)

(73) Assignee: SPECTRONIX CORPORATION, Ibaraki-shi (JP)

( * ) Notice: Subject to any disclaimer, the term of this patent is extended or adjusted under 35 U.S.C. 154(b) by 0 days.

(21) Appl. No.: 15/119,048

(22) PCT Filed: Feb. 9, 2015

(86) PCT No.: PCT/JP2015/053459
§ 371 (c)(1),
(2) Date: Aug. 15, 2016

(87) PCT Pub. No.: WO2015/122375
PCT Pub. Date: Aug. 20, 2015

(65) Prior Publication Data
US 2017/0012402 A1    Jan. 12, 2017

(30) Foreign Application Priority Data

Feb. 13, 2014  (JP) ................................ 2014-025014

(51) Int. Cl.
*H01S 3/30*  (2006.01)
*H01S 3/106* (2006.01)
(Continued)

(52) U.S. Cl.
CPC ............... *H01S 3/106* (2013.01); *G02F 1/37* (2013.01); *H01S 3/0085* (2013.01); *H01S 3/067* (2013.01);
(Continued)

(58) Field of Classification Search
CPC ............ H01S 3/06716; H01S 3/06758; H01S 3/094076; H01S 3/1068; H01S 3/108;
(Continued)

(56) References Cited

U.S. PATENT DOCUMENTS

2004/0240037 A1   12/2004  Harter
2008/0024859 A1    1/2008  Tamaoki
(Continued)

FOREIGN PATENT DOCUMENTS

JP          5-5912    *  1/1993
JP      H05-5912 A       1/1993
(Continued)

OTHER PUBLICATIONS

Yosuke Orii et al. "Generation of High Power Picosecond DUV Pulses by Using a Gain-Switched Semiconductor Seed Laser". Dai 60 Kai Extended Abstracts, Japan Society of Applied Physics and Related Societies, The Japan Society of Applied Physics, Mar. 2013, p. 04-127.*

(Continued)

*Primary Examiner* — Tuan Nguyen
(74) *Attorney, Agent, or Firm* — Oliff PLC

(57) ABSTRACT

A laser light-source apparatus includes: fiber amplifiers and a solid state amplifier configured to amplify pulse light output from a seed light source based on gain switching; nonlinear optical elements configured to perform wavelength conversion on the pulse light output from the solid state amplifier; an optical switching element configured to permit or stop propagation of pulse light from the fiber amplifier to the solid state amplifier; and a control unit configured to control the optical switching element in such a manner that the propagation of the light is stopped in an output period of the pulse light from the seed light source, (Continued)

and permitted in a period other than the output period of the pulse light from the seed light source.

14 Claims, 7 Drawing Sheets

(51) Int. Cl.
    *H01S 3/067*     (2006.01)
    *H01S 3/094*     (2006.01)
    *H01S 3/0941*     (2006.01)
    *H01S 3/10*     (2006.01)
    *H01S 3/16*     (2006.01)
    *H01S 3/23*     (2006.01)
    *G02F 1/37*     (2006.01)
    *H01S 3/131*     (2006.01)
    *H01S 5/12*     (2006.01)
    *H01S 3/108*     (2006.01)
    *H01S 3/00*     (2006.01)

(52) U.S. Cl.
CPC ...... *H01S 3/06758* (2013.01); *H01S 3/09415* (2013.01); *H01S 3/094076* (2013.01); *H01S 3/10* (2013.01); *H01S 3/10007* (2013.01); *H01S 3/108* (2013.01); *H01S 3/131* (2013.01); *H01S 3/1611* (2013.01); *H01S 3/1618* (2013.01); *H01S 3/1643* (2013.01); *H01S 3/2316* (2013.01); *H01S 3/2375* (2013.01); *H01S 5/12* (2013.01); *H01S 3/0064* (2013.01); *H01S 3/0092* (2013.01); *H01S 3/2333* (2013.01); *H01S 2301/02* (2013.01)

(58) Field of Classification Search
CPC .... H01S 3/1666; H01S 3/1673; H01S 3/2333; H01S 3/2316
See application file for complete search history.

(56) References Cited

U.S. PATENT DOCUMENTS

| | | |
|---|---|---|
| 2008/0130099 A1 | 6/2008 | Harter |
| 2009/0097520 A1 | 4/2009 | Harter |
| 2012/0269212 A1 | 10/2012 | Harter |
| 2012/0300798 A1 | 11/2012 | Harter |

FOREIGN PATENT DOCUMENTS

| | | | |
|---|---|---|---|
| JP | 2008-034532 A | | 2/2008 |
| JP | 20008-034532 | * | 2/2008 |
| JP | 2013-156650 A | | 8/2013 |

OTHER PUBLICATIONS

Jul. 21, 2015 International Search Report issued in International Patent Application No. PCT/JP2015/053459.
Jul. 21, 2015 Written Opinion issued in International Patent Application No. PCT/JP2015/053459.

* cited by examiner

Fig2.B

Band broadening

ASE noise

Band broadening

ASE noise

LASER LIGHT-SOURCE APPARATUS AND LASER PULSE LIGHT GENERATING METHOD

TECHNICAL FIELD

The present invention relates to laser light-source apparatus and a laser pulse light generating method, used for various types of laser processing.

BACKGROUND ART

In recent years, laser light is used for various types of processing. Laser light with a wavelength approximately in a range from 532 nm to 1064 nm has a high energy intensity, and are suitably used for various types of processing such as cutting or welding of metal, glass, and the like. Laser light with a wavelength in a deep ultraviolet region, which is approximately from 200 nm to 350 nm, is used for processing electronic materials and composite materials.

Laser light-source apparatus that outputs laser light with a wavelength shorter than those in a near-infrared region includes: a seed light source that outputs laser light having a wavelength in the near-infrared region; an optical amplifier that amplifies the laser light output from the seed light source; and a nonlinear optical element that converts the wavelength of the laser light, amplified by the optical amplifier, into a target wavelength.

Various optical amplifiers and the like are used for various seed light sources selected to achieve a pulse width of several hundreds of picoseconds or shorter and a frequency of several hundreds of megahertz or lower, so that a laser pulse light with large peak power is obtained.

Some conventional configurations use a mode-locked laser with a pulse rate of several tens of megahertz as such a seed light source, and pulse light of several kilohertz is obtained by dividing the frequency of the pulse light output from the seed light source.

Unfortunately, the mode-locked laser involves an oscillating frequency that is fluctuated by environmental factors such as temperature and vibration and thus is difficult to appropriately control. Thus, the frequency division needs to be synchronized with the oscillating frequency of the laser pulse light detected by using a light-receiving element and the like. Thus, a complex circuit configuration is required. Furthermore, long term stable driving is difficult to achieve because the mode-locked laser includes a saturable absorber, which is apt to degrade.

Use of a semiconductor laser that emits pulse light with a controllable oscillating frequency for the seed light source might seem like a solution. Unfortunately, the semiconductor laser is only capable of emitting near-infrared pulse light with extremely small pulse energy of several picojoules to several hundreds of picojoules. Thus, to eventually obtain the pulse light with the pulse energy of several tens of microjoules to several tens of millijoules, much stronger amplification is required than in the case where the conventional seed light source is used.

Suitable examples of the optical amplifier achieving such strong amplification include: a fiber amplifier such as an erbium-doped fiber amplifier and an ytterbium-doped fiber amplifier; and a solid state amplifier such as Nd:YAG obtained by adding neodymium to yttrium aluminum garnet and Nd:YVO4 obtained by adding neodymium to yttrium vanadate.

Patent Literature 1 and Patent Literature 2 each disclose an optical amplifier as a combination of the fiber amplifier and the solid state amplifier described above. As described in Patent Literature 1 and Patent Literature 2, the fiber amplifier and the solid state amplifier both require an excitation light source for amplifying light with the same wavelength as laser light amplified by a pumping effect in a laser active region. Generally, a semiconductor laser is used for such an excitation light source.

PRIOR ART DOCUMENTS

Patent Documents

[PTL 1] Japanese Unexamined Patent Application Publication No. 2011-192831
[PTL 2] WO2008/014331

SUMMARY OF INVENTION

Problems to be Solved by the Invention

There might be cases where the output of the pulse light should be temporarily stopped during a processing work performed by using the pulse light output from the laser light-source apparatus. In such a case, stopping of the oscillation of the seed light source or the stopping of the propagation of the pulse light to the light amplifier leads to an excessive population inversion state because each laser active region continues to be excited by an excitation laser beam source, provided in the light amplifier. As a result, the next time the seed light source is oscillated or the propagation of the pulse light to the light amplifier is permitted, pulse light (hereinafter, also referred to as "giant pulse") with peak power extremely larger than that in a normal state is output to damage the solid state amplifier, the nonlinear optical element, or the like.

When the output of the pulse light is resumed, after being temporally stopped, with excessive energy accumulated in a solid state laser medium of the solid state amplifier, the solid state laser medium emits an excessive amount of heat causing a temperature rise to degrade beam propagation characteristics. Thus, the quality of a subject of the processing using the laser pulse light might be adversely affected.

In view of the problems described above, an object of the present invention is to provide a laser light-source apparatus and a laser pulse light generating method in which when an output of pulse light from the apparatus is temporarily stopped while a seed light source is driven, a solid state amplifier, a nonlinear optical element, and the like can be prevented from being damaged, so that beam propagation characteristics can be prevented from degrading immediately after the output is resumed, without stopping an excitation light source.

Means for Solving the Problems

A first characteristic configuration of a laser light-source apparatus according to the present invention, for achieving the object described above, is that, as set forth in claim 1: a laser light-source apparatus including: a seed light source configured to output pulse light based on gain switching; a fiber amplifier configured to amplify the pulse light output from the seed light source; a solid state amplifier configured to amplify the pulse light output from the fiber amplifier; and a nonlinear optical element configured to perform wavelength conversion on the pulse light output from the solid state amplifier and output the resultant pulse light; includes: an optical switching element that is disposed between the fiber amplifier and the solid state amplifier, and is configured to permit or stop propagation of light from the fiber amplifier to the solid state amplifier; and a control unit configured to control the optical switching element in such a manner that the propagation of the light is stopped in an output period of the pulse light from the seed light source, and permitted in a period other than the output period of the pulse light from the seed light source to achieve an output stopped state in which the output of the pulse light from the nonlinear optical element is stopped.

The control unit controls the optical switching element in such a manner that propagation of the light from the fiber amplifier to the solid state amplifier is stopped in the output period of the pulse light from the seed light source. Thus, the output stopped state in which the output of the pulse light from the nonlinear optical element is stopped can be achieved without stopping the seed light source.

In the output stopped state, the control unit controls the optical switching element in such a manner that the propagation of light is permitted in the period other than the output period of the pulse light from the seed light source. Thus, spontaneous emission noise (hereinafter, referred to as "Amplified Spontaneous Emission (ASE) Noise") produced in a fiber amplifier on an upstream stage propagates to the solid state amplifier on a downstream stage, whereby energy in an active region of the solid state amplifier that has been put into an excited state by an excitation light source is discharged.

As a result, no giant pulse is generated to damage the solid state amplifier and the nonlinear optical element even when the control unit controls the optical switching element in such a manner that the pulse light from the seed light source propagates from the fiber amplifier to the solid state amplifier and the nonlinear optical element outputs the pulse light, after the output stopped state has ended.

Furthermore, excessive heat emission of the solid state laser medium is prevented, whereby the beam propagation characteristics immediately after the output is resumed are not degraded. Thus, the quality of a subject of the processing using the laser pulse light is not adversely affected.

The ASE noise, amplified by propagating to the solid state amplifier in the period other than the output period of the pulse light from the seed light source, might enter the nonlinear optical element. However, the ASE noise inherently has a low intensity and a wide wavelength bandwidth overwhelming the wavelength conversion characteristics of the nonlinear optical element, and thus would not be output as light with large peak power. The ASE noise output from the fiber amplifier will not be amplified to light with large peak power, and thus can be blocked by the optical switching element with no damage on peripheral optical components including the switching element.

A second characteristic configuration of the laser light-source apparatus according to the present invention is that, as set forth in claim 2: the control unit may be configured to periodically or intermittently control an excitation light source of the fiber amplifier and/or the solid state amplifier in such a manner that the fiber amplifier and/or the solid state amplifier enters a population inversion state at least before receiving the pulse light output from the seed light source, in addition to the first characteristic configuration described above.

In the configuration described above, excitation light source is periodically or intermittently driven in such a manner that the fiber amplifier and/or the solid state amplifier enters a population inversion state before receiving the pulse light output from the seed light source, in addition to the first characteristic configuration described above. Thus, wasteful energy consumption not contributing to the pulse light amplification as well as heat emission can be reduced.

A third characteristic configuration of the laser light-source apparatus according to the present invention is that, as set forth in claim 3: the control unit may be configured to control the optical switching element in such a manner that the propagation of the light is permitted in the output period of the pulse light from the seed light source, and stopped in the period other than the output period of the pulse light from the seed light source to achieve an output permitted state in which the output of the pulse light from the nonlinear optical element is permitted. in addition to the first or second characteristic configuration described above.

It has been widely known that when the pulse light (the signal light) output from the seed light source is amplified by the fiber amplifier, the spectrum is widened over the bandwidth of this signal light due to chirping effect, self-phase modulation or Raman scattering in the optical fiber, or the like, and the ASE noise described above is also produced, and thus the SN ratio of the pulse light degrades.

When the frequency of the pulse light is in the order of megahertz or higher, the ASE noise is so small that would not be much of a problem. The adverse effect of the ASE noise is large when the oscillating frequency of the pulse light is in a range lower than one megahertz. Specifically, a part of the energy of the excitation light, input for the amplification of the solid state amplifier on the downstream stage, is wastefully used for amplifying such a noise component. Thus, not only the amplification gain is low due to a low energy use efficiency for amplifying the pulse light, but also the energy consumed for amplifying the noise component leads to excessively emitted heat. As a result, a larger components cost and the like are required for cooling the solid state amplifier and the like.

When the control unit controls the optical switching element in such a manner that the propagation of the light is stopped in the period other than the output period of the pulse light from the seed light source in the output permitted state in which the output of the pulse light from the nonlinear optical element is permitted, the ASE noise is prevented from propagating to the solid state amplifier in such a period. Thus, the energy in the active region of the solid state amplifier is prevented from being wastefully consumed.

Then, when the control unit controls the optical switching element in such a manner that the propagation of the light is permitted in the output period of the pulse light from the seed light source in the output permitted state, the pulse light propagates from the fiber amplifier to the solid state amplifier only in such a period. Thus, the pulse light is amplified with a high energy efficiency, whereby the pulse light with large peak power is output from the nonlinear optical element. In this manner, the optical switching element functions as a filter that removes the ASE noise in a time domain.

A fourth characteristic configuration of the laser light-source apparatus according to the present invention is that, as set forth in claim 4: the control unit may be configured to shift in a stepwise or continuous manner, an output timing of a control signal for controlling the optical switching element in such a manner that the propagation of the light is permitted so that the output stopped state transitions to the output permitted state, in a period between output periods of a plurality of pulse light beams repeatedly output from the seed light source, in addition to any of the first to third characteristic configurations described above.

In the output stopped state, when the output timing of the control signal, for controlling the optical switching element so that the propagation of the light is permitted, is shifted in an advancing or delaying direction in the stepwise or continuous manner during the period other than the output period of the pulse light output from the seed light source, the output timing eventually overlaps with the output period of the pulse light output from the seed light source, whereby the output permitted state is achieved.

For example, in a transitioning state involving a transition from the output stopped state to the output permitted state, the output period of the pulse light output from the seed light source overlaps with a transitioning timing at which the optical switching element transitions to the ON state, and then transition to an appropriate ON state is achieved.

The energy of the pulse light, propagating to the solid state amplifier through the optical switching element, is extremely small at an initial point due to a response delay of the optical switching element and the like, and then gradually increases. Thus, even when the active region of the solid state amplifier is in an excessive population inversion state, the energy in the active region is consumed by the amplification of the pulse light at the initial point with the extremely small energy, whereby no giant pulse is generated.

For example, when the response speed of the optical switching element 40 is sufficiently fast, the pulse width of the light pulse propagating to the solid state amplifier through the optical switching element is extremely short at the initial point, and then gradually increases. Thus, even when the active region of the solid state amplifier is in an excessive population inversion state, the energy in the active region is consumed by the amplification of the light pulse at the initial point with the extremely short pulse width, whereby no giant pulse is generated.

A fifth characteristic configuration of the laser light-source apparatus according to the present invention is that, as set forth in claim 5: the optical switching element may include a dynamic optical element including an acousto-optic element or an electro-optic element, in addition to any of the first to fourth characteristic configurations described above.

As the optical switching element, an acousto-optic element that turns ON or OFF the primary diffracted light in accordance with the turning ON or OFF of an ultrasound transducer, or an electro-optic element that turns ON and OFF light with an electric field in accordance with intensity modulation through EO modulation is preferably used as the dynamic optical element.

A sixth characteristic configuration of the laser light-source apparatus according to the present invention is that, as set forth in claim 6: the control unit may be configured to control the seed light source based on a control signal for the optical switching element, in addition to the fifth characteristic configuration described above.

Even when the response of the optical switching element is slower than the response of the pulse light output from the seed light source, the optical switching element can be driven at an appropriate timing with a control signal for controlling the seed light source generated based on the control signal for the optical switching element A seventh characteristic configuration of the laser light-source apparatus according to the present invention is that, as set forth in claim 7: the seed light source may include a DFB laser, and the control unit may be configured to drive the DFB laser with a frequency of several megahertz or lower and a pulse width of several hundreds of picoseconds or shorter, in addition to any of the first to sixth characteristic configurations described above.

When the DFB laser employing the gain switching is used as the seed light source, single longitudinal mode pulse light having a higher intensity than in a normal state can be obtained. With the gain switching, pulse light with a monochromatic wave or a desired frequency that is several megahertz or lower and having a desired pulse width that is several hundreds of picoseconds or shorter can be easily generated. By using the optical switching element described above for the pulse light, pulse light with a higher average output and a desired wavelength can be efficiently obtained.

A first characteristic configuration of a laser pulse light generating method according to the present invention is, as set forth in claim 8: a laser pulse light generating method in which pulse light output from a seed light source based on gain switching is sequentially amplified by a fiber amplifier and a solid state amplifier, subjected to wavelength conversion by a nonlinear optical element, and then is output, the method including controlling, when the output of the pulse light from the nonlinear optical element is stopped, an optical switching element disposed between the fiber amplifier and the solid state amplifier in such a manner that propagation of light is stopped in an output period of the pulse light from the seed light source, and permitted in a period other than the output period of the pulse light from the seed light source.

A second characteristic configuration of the laser pulse light generating method according to the present invention is that, as set forth in claim 9: when the output of the pulse light from the nonlinear optical element is permitted, the optical switching element may be controlled in such a manner that the propagation of light is permitted in the output period of the pulse light from the seed light source, and stopped in the period other than the output period of the pulse light from the seed light source, in addition to the first characteristic configuration described above.

Effects of Invention

As described above, the present invention can provide a laser light-source apparatus and a laser pulse light generating method in which when an output of pulse light from the apparatus is temporarily stopped while a seed light source is driven, a damage of a solid state amplifier, a nonlinear optical element, and the like can be prevented and thus degradation of beam propagation characteristics immediately after the output is resumed can be prevented, without stopping an excitation light source.

BRIEF DESCRIPTION OF DRAWINGS

FIG. 2B is a diagram illustrating frequency and the time axis characteristics of pulse light the bandwidth of which has been increased by self-phase modulation and Raman scattering in a fiber amplifier.

EMBODIMENTS FOR CARRYING OUT THE INVENTION

Figure 1:
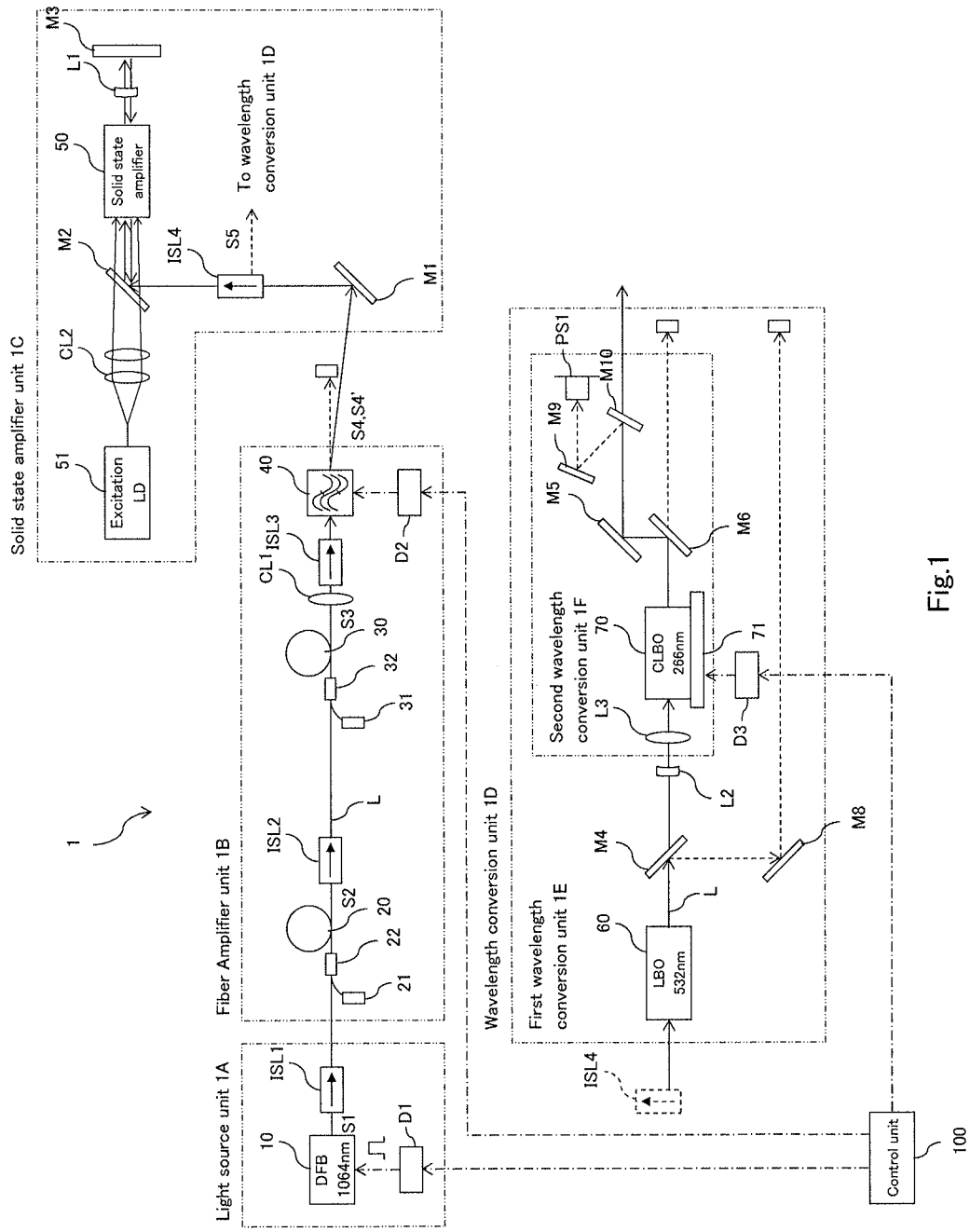
FIG. 1 is a block diagram illustrating a configuration of a laser light-source apparatus.

Embodiments of laser light-source apparatus and a laser pulse light generating method according to the present invention are described. FIG. 1 illustrates an example of a configuration of a laser light-source apparatus 1 according to the present invention. The laser light-source apparatus 1 includes a light source unit 1A, a fiber amplifier unit 1B, a solid state amplifier unit 1C, and a wavelength conversion unit 1D that are arranged along an optical axis L, and further includes a control unit 100 that controls the light source unit 1A and the like.

The light source unit 1A includes a seed light source 10, a seed light source driver D1, an optical isolator ISL1, and the like. The fiber amplifier unit 1B includes: fiber amplifiers 20 and 30, in two stages, respectively including excitation light sources 21 and 31, each including a laser diode, and multiplexers 22 and 32; optical isolators ISL2 and ISL3; an optical switching element 40; and the like.

The solid state amplifier unit 1C includes a solid state amplifier 50, reflection mirrors M1, M2, and M3, a lens L1, a collimator CL2, and the like. The wavelength conversion unit 1D includes a first wavelength conversion unit 1E and a second wavelength conversion unit 1F that are respectively provided with nonlinear optical elements 60 and 70.

Laser pulse light (hereinafter, also referred to as "pulse light") with a wavelength of 1064 nm, output from the seed light source 10, is amplified by the fiber amplifiers 20 and 30 in the two stages, and then is further amplified to a predetermined level by the solid state amplifier 50 in a single stage. The pulse light amplified by the solid state amplifier 50 is subjected to wavelength conversion by the nonlinear optical element 60 to have a wavelength of 532 nm, further subjected to wavelength conversion by the nonlinear optical element 70 to have a wavelength of 266 nm, and then is output.

The number of fiber amplifiers and solid state amplifiers are not particularly limited, and may be set as appropriate to achieve a desired amplification gain for the pulse light. For example, three fiber amplifiers may be cascaded, and two solid state amplifiers may be cascaded in the subsequent stage.

A distributed feedback laser diode (hereinafter, referred to as a "DFB laser") that outputs a single longitudinal mode laser light is used for the seed light source 10. The DFB laser outputs pulse light with a monochromatic wave or a desired frequency that is several megahertz or lower and having a desired pulse width that is several hundreds of picoseconds or shorter, in response to a control signal output from the control unit 100 employing gain switching.

The pulse light, having the pulse energy of several to several hundreds of picojoules, output from the seed light source 10, is amplified by the fiber amplifiers 20 and 30 and the solid state amplifier 50 to have the final pulse energy of several tens of microjoules to several tens of millijoules. Then, the resultant pulse light is input to the two-stage nonlinear optical elements 60 and 70 to be subjected to the wavelength conversion. As a result, deep ultraviolet light with a wavelength of 266 nm is obtained.

The pulse light output from the seed light source 10 is amplified in the fiber amplifier 20 on the upstream stage, through the optical isolator ISL1. A rare-earth-doped optical fiber, such as an ytterbium (Yb)-doped fiber amplifier excited by the excitation light source 21 with a predetermined wavelength (for example 975 nm) is used for the fiber amplifiers 20 and 30. The population inversion of such a fiber amplifier 20 lasts for milliseconds, and thus energy excited by the excitation light source 21 is efficiently transferred to the pulse light having a frequency of 1 kilohertz or higher.

The pulse light that has been amplified by the fiber amplifier 20 on the upstream stage by about 30 decibels is input to the fiber amplifier 30 on the downstream stage through the optical isolator ISL2 to be amplified by about 25 decibels. The pulse light that has been amplified in the fiber amplifier 30 on the downstream stage is subjected to beam shaping by a collimator CL1, and then is guided to the solid state amplifier 50, after passing through the optical isolators ISL3 and ISL4, to be amplified by about 25 decibels.

In the present embodiment, the collimator CL1 performs the beam shaping on the pulse light output from the fiber amplifier 30 so that the beam waist is positioned right in front of the incident surface of the solid state amplifier 50, whereby efficient optical amplification is achieved despite the thermal lens effect in the solid state amplifier 50.

An Acousto-Optic Modulator (AOM) that includes an acousto-optic element and functions as the optical switching element 40 and a pair of reflection mirrors M1 and M2 are disposed between the collimator CL1 and the solid state amplifier 50. An optical isolator ISL4 that guides the pulse light amplified by the solid state amplifier 50 to the nonlinear optical element 60 is disposed between the reflection mirrors M1 and M2.

The optical isolators ISL1 to ISL4 described above are each a polarization-dependent optical isolator that blocks return light by rotating the plane of polarization to be in a reverse direction for a direction opposite to the forward direction, through the magneto-optical effect. Thus, the optical isolators ISL1 to ISL4 are disposed, for example, to prevent the optical elements disposed on the upstream side along the optical axis from breaking due to heat of the return light with a high intensity.

A solid state laser medium such as a Nd:YVO4 crystal or a Nd:YAG crystal is preferably used for the solid state amplifier 50. The solid state laser medium is excited by excitation light output from an excitation light source 51, including a laser diode that emits light having a wavelength of 808 nm or 888 nm, and then is subjected to beam shaping by the collimator CL2.

The pulse light that has passed through the optical switching element 40 enters the solid state amplifier 50 via the reflection mirrors M1 and M2 to be amplified, and then is reflected by the reflection mirror M3 to reenter the solid state amplifier 50 to be amplified again. Thus, the pulse light is amplified while passing through the solid state amplifier 50 in opposite directions. The lens L1 is for beam shaping.

The pulse light amplified by the solid state amplifier 50 is reflected by the reflection mirror M2 and the optical isolator ISL4. Thus, the pulse light enters the nonlinear optical elements 60 and 70 of the wavelength conversion unit 1D to have the wavelength converted into a desired wavelength, and then is output.

The first wavelength conversion unit 1E includes a LBO crystal ($LiB_3O_5$) serving as the nonlinear optical element 60, and the second wavelength conversion unit 1F includes a CLBO crystal ($CsLiB_6O_{10}$) serving as the nonlinear optical element 70. The pulse light, with a wavelength of 1064 nm, output from the seed light source 10, is subjected to wavelength conversion in the nonlinear optical element 60 to have a wavelength of 532 nm, and then is subjected to wavelength conversion in the nonlinear optical element 70 to have a wavelength of 266 nm.

Reflection mirrors M4 and M8 function as filters for separating the pulse light having a wavelength of 1064 nm output from the nonlinear optical element 60. A reflection mirror M6 functions as a filter for separating the pulse light having a wavelength of 532 nm output from the nonlinear optical element 70. Each pulse light thus separated is attenuated by an optical damper.

The second wavelength conversion unit 1F is provided with a stage 71 serving as a scanning mechanism that causes the CLBO crystal ($CsLiB_6O_{10}$) to move in a plane orthogonal to the optical axis, so that the position on the CLBO crystal ($CsLiB_6O_{10}$) irradiated with the pulse light is shifted at a predetermined timing. This is because when the same position on the CLBO crystal ($CsLiB_6O_{10}$) is irradiated with the ultraviolet ray for a long period of time, the CLBO crystal ($CsLiB_6O_{10}$) is optically damaged to have the intensity distribution and the wavelength conversion output performance degraded.

The control unit 100 includes a circuit block including a Field Programmable Gate Array (FPGA), a peripheral circuit, and the like. A plurality of logical elements are driven based on a program stored in a memory in the FPGA in advance, so that, for example, the blocks of the laser light-source apparatus 1 are sequentially controlled. The control unit 100 may employ a configuration including a microcomputer, a memory, and a peripheral circuit such as an IO or a configuration including a programmable logic controller (PLC), instead of the configuration including the FPGA.

Specifically, the control unit 100 transmits a trigger signal, having a predetermined pulse width, to the driver D1 of the DFB laser serving as the seed light source 10 so that the seed light source 10 emits light based on gain switching. When a pulse current, corresponding to the trigger signal, is applied to the DFB laser from the driver D1, relaxation oscillation occurs. Here, a laser pulse light is output that includes only a first wave corresponding to the highest emission intensity immediately after the start of the light emission by the relaxation oscillation and includes no sub-pulses as a second wave and after. The gain switching is a method of thus generating pulse light with a short pulse width and large peak power through the relaxation oscillation.

The control unit 100 outputs a gate signal to an RF driver D2 that drives the AOM serving as the optical switching element 40. A transducer (piezoelectric conversion element) that has received a high frequency signal from the RF driver D2 generates a diffraction grating in the crystal of the acousto-optic element, so that diffracted light of the pulse light that has entered the acousto-optic element is made incident on the reflection mirror M1. When the RF driver D2 is stopped, the pulse light passes through the acousto-optic element without being diffracted, and thus is not made incident on the reflection mirror M1. The light that has passed through the acousto-optic element while the RF driver D2 is stopped is attenuated by the optical damper.

When the optical switching element 40 is turned ON by the gate signal, the diffracted light propagates to the solid state amplifier 50 from the fiber amplifier 30. When the optical switching element 40 is turned OFF by the gate signal, the propagation of the light to the solid state amplifier 50 from the fiber amplifier 30 is stopped.

The control unit 100 controls and thus moves the stage 71 in a stepwise manner, so that the position of the CLBO crystal ($CsLiB_6O_{10}$) irradiated with the pulse light is shifted at a predetermined timing. For example, the intensity of the ultraviolet light, as a result of the wavelength conversion, is monitored, and the stage 71 is moved so that the position on the CLBO crystal ($CsLiB_6O_{10}$) irradiated with the pulse light is shifted when the history of the monitored intensity matches a predetermined pattern.

The stage 71 is coupled to an X direction movement motor and/or a Y direction movement motor, controlled by the control unit 100 via a motor driver D3, in a driving force transmittable manner, and thus is movable on an X-Y plane orthogonal to the optical axis of the pulse light.

Figure 2A:
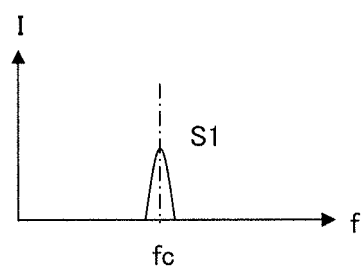
FIG. 2A is a diagram illustrating frequency and time axis characteristics of narrowband pulse light emitted from a seed light source.
Figure 2A:
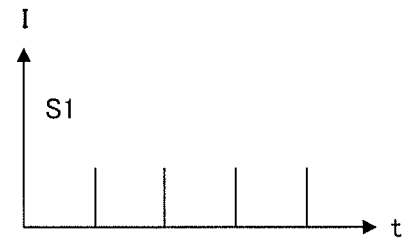
Figure 2A:
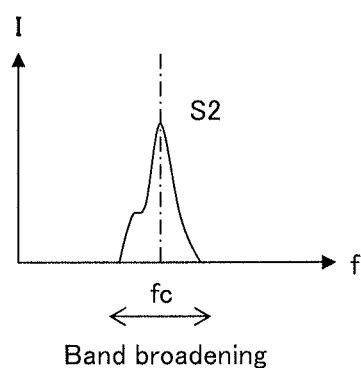
Figure 2A:
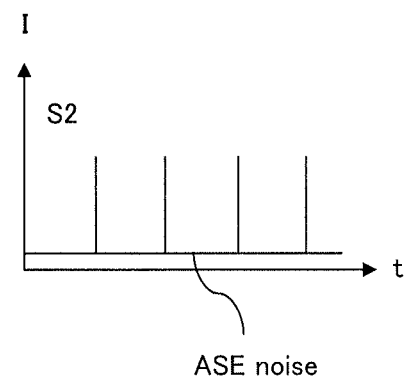
Figure 2C:
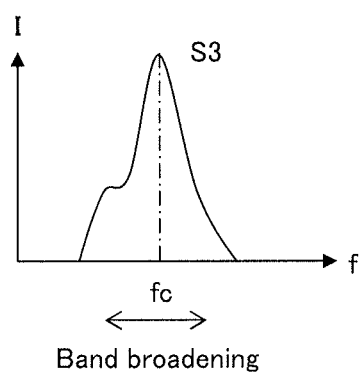
FIG. 2C is a diagram illustrating frequency and the time axis characteristics of pulse light the bandwidth of which has been increased by self-phase modulation and Raman scattering in a fiber amplifier.
Figure 2C:
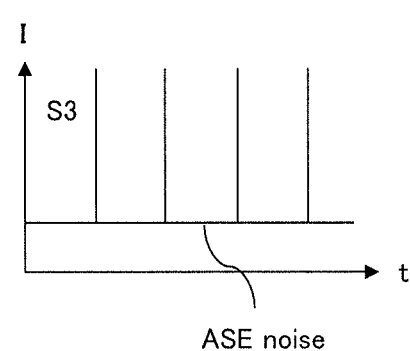

In each of FIG. 2A, FIG. 2B, and FIG. 2C, the frequency characteristics of the pulse light propagating in components of the laser light-source apparatus 1 is illustrated in a left side figure, and the time axis characteristics of the pulse light is illustrated in a right side figure. In the figures, the reference sign Sn (n is an integer) represents an optical signal Sn (n=1, 2, . . . ) from an output node of components of the laser light-source apparatus 1 illustrated in FIG. 1.

A laser pulse light having a small bandwidth with the center wavelength of 1064 nm (see FIG. 2A) is output from the DFB laser, serving as the seed light source 10, at a predetermined cycle, in response to the trigger signal output from the control unit 100. When the pulse light output from the seed light source 10 is guided by the fiber amplifier 20 and amplified, an unwanted spectrum width increase occurs due to self-phase modulation, Raman scattering, and the like. Furthermore, the ASE noise is produced, and thus the S/N ratio of the optical pulse is degraded (see FIG. 2B). A further increase of the bandwidth and a further increase in the ASE noise level occur (see FIG. 2C) when the pulse light is guided to and amplified by the fiber amplifier 30 on the downstream stage.

The pulse light amplified by the fiber amplifiers 20 and 30 needs to be further amplified by the solid state amplifier 50 on the downstream stage to achieve larger peak power, so that the deep ultraviolet pulse light of a predetermined intensity can be obtained. The range of wavelengths achievable by the wavelength conversion by the wavelength conversion unit 1D is limited by the characteristics of the nonlinear optical elements 60 and 70. Thus, the energy used for the amplification does not efficiently contribute to the wavelength conversion. All things considered, the wavelength conversion efficiency is low.

The excitation energy of the solid state amplifier 50 is wastefully consumed for the pulse light with an increased bandwidth and the amplified ASE noise. Thus, the energy efficiency is low. When the excitation energy is increased to offset the wastefully consumed amount, a large scale cooling device is required for preventing damages due to emitted heat on the elements. Thus, the cost of the laser light-source apparatus 1 increases. When the frequency of the pulse light is in the order of megahertz or higher, the ASE noise is so small that would not be much of a problem. The adverse effect of the ASE noise is large when the oscillating frequency of the pulse light is in a range lower than one megahertz.

There might be cases where the output of the pulse light with a wavelength in the deep ultraviolet region output from the laser light-source apparatus 1 should be temporarily stopped during laser processing performed by using such pulse light. In such a case, stopping of the oscillation of the seed light source 10 or the stopping of the propagation of the pulse light to the light amplifiers 20, 30, and 50 leads to an excessive population inversion state because each laser active region continues to be excited by excitation laser beam sources, provided in the light amplifiers 20, 30, and 50.

As a result, the next time the seed light source is oscillated or the propagation of the pulse light to the light amplifier 50 is permitted, giant pulse is output to damage the solid state amplifier 50, the nonlinear optical element on the downstream stage, or the like.

Thus, in the present embodiment, the control unit 100 controls the optical switching element 40 in such a manner that the propagation of light is permitted in an output period of the pulse light from the seed light source 10, and stopped in a period other than the output period of the pulse light from the seed light source 10. Thus, an output permitted state where the output of the pulse light from the nonlinear optical elements 60 and 70 is permitted is achieved.

The control unit 100 controls the optical switching element 40 in such a manner that the propagation of light is stopped in the output period of the pulse light from the seed light source 10 and is permitted in a period other than the output period of the pulse light from the seed light source 10. Thus, an output stopped state is achieved in which the output of the pulse light from the nonlinear optical elements 60 and 70 is stopped.

When the control unit 100 turns OFF the optical switching element 40 in the period other than the output period of the pulse light from the seed light source 10 in the output permitted state, the ASE noise is prevented from propagating to the solid state amplifier 50 on the downstream stage in this period. As a result, the energy in an active region of the solid state amplifier 50 is prevented from being wastefully consumed (see a section Toff in FIG. 3D).

Figure 3A:
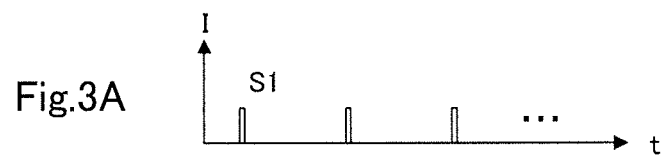
FIG. 3A is a diagram illustrating pulse light periodically emitted from the seed light source.
Figure 3B:
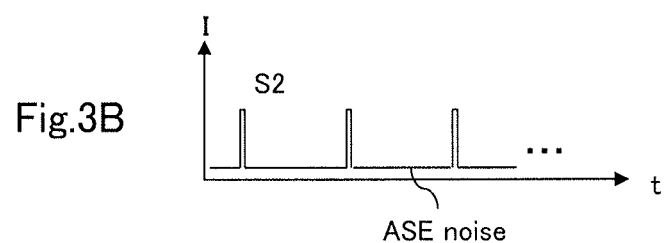
FIG. 3B is a diagram illustrating pulse light in which ASE noise has been superimposed in an upstream stage fiber amplifier.
Figure 3C:
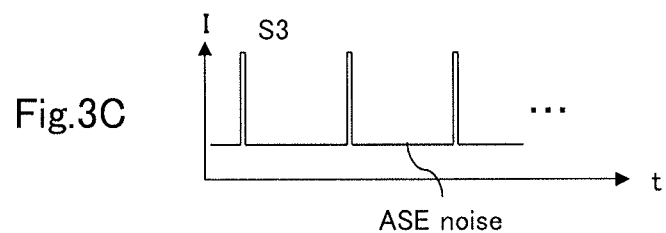
FIG. 3C is a diagram illustrating pulse light in which ASE noise has been further superimposed in a downstream stage fiber amplifier.
Figure 3D:
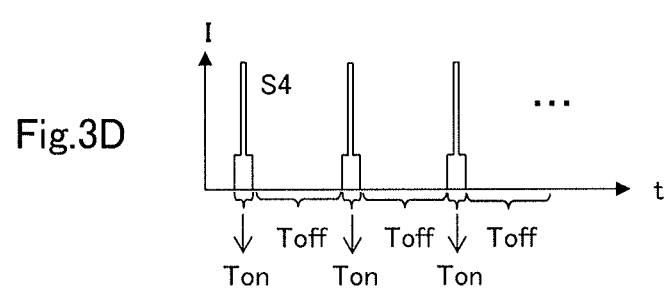
FIG. 3D is a diagram illustrating pulse light passing through an optical switching element in synchronization with an oscillation period of the seed light source in a time domain.

Then, when the optical switching element 40 is turned ON by the control unit 100 in the output period of the pulse light from the seed light source 10, the pulse light propagates from the fiber amplifier 30 to the solid state amplifier 50 (see a section Ton in FIG. 3D). Thus, the pulse light is amplified with a high energy efficiency (see FIG. 3F), whereby the pulse light with large peak power is output from the nonlinear optical element. In this manner, the optical switching element 40 functions as a filter that removes the ASE noise in a time domain.

When the control unit 100 turns OFF the optical switching element 40 in the output period of the pulse light from the seed light source 10, the pulse light is prevented from propagating to the solid state amplifier 50 from the fiber amplifier 30. Thus, the output stop state in which the output of the pulse light from the nonlinear optical elements 60 and 70 is stopped can be easily achieved without stopping the seed light source 10.

Figure 3E:
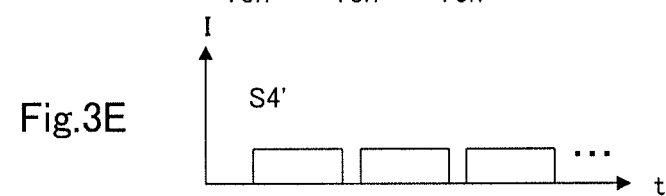
FIG. 3E is a diagram illustrating ASE noise passing though the optical switching element before and after the oscillation period of the seed light source in a time domain.
Figure 3F:
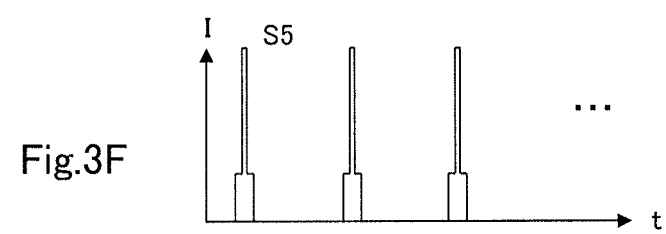
FIG. 3F is a diagram illustrating pulse light amplified by a solid state amplifier after passing through the optical switching element in synchronization with the oscillation period of the seed light source in the time domain.

When the optical switching element 40 is turned ON by the control unit 100 in the period other than the output period of the pulse light from the seed light source 10 in the output stopped state, the ASE noise generated in the fiber amplifier 30 on the upstream stage propagates to the solid state amplifier on the downstream stage (see FIG. 3E). Thus, the energy in the active region of the solid state amplifier 50, which has been put into the excited state by the excitation light source 51, is discharged.

As a result, no giant pulse is generated to damage the solid state amplifier 50 and the nonlinear optical elements 60 and 70, even when the control unit 100 turns ON the optical switching element 40 in the output period of the pulse light from the seed light source 10 and the pulse light is output from the wavelength conversion devices 60 and 70, in the output permitted state achieved after the output stopped state.

Furthermore, excessive heat emission of a solid state laser medium is prevented, whereby the beam propagation characteristics immediately after the output is resumed are not degraded. Thus, the quality of the subject of the processing using the laser pulse light is not adversely affected.

The ASE noise, amplified by the solid state amplifier 50 in the period other than the output period of the pulse light from the seed light source 10, might enter the nonlinear optical elements 60 and 70. However, the ASE inherently has a low intensity and a wide wavelength bandwidth overwhelming the wavelength conversion characteristics of the nonlinear optical elements 60 and 70, and thus would not be output as light with large peak power. The light output from the fiber amplifier 30 will not be amplified to light with large peak power, and thus can be blocked by the optical switching element 40 with no damage due to heat or the like on peripheral optical components including the optical switching element 40.

The "output period of the pulse light from the seed light source", in which the optical switching element 40 is ON due to the control performed by the control unit 100, in the output permitted state is not necessarily the entire output period of the pulse light from the seed light source, and may be a part of such a period as long as the peak power of the pulse light, obtained by the wavelength conversion by the nonlinear optical element, can be within a range of appropriate values. Furthermore, the concept of the period includes short periods before and after the output period of the pulse light from the seed light source.

The "period other than the output period of the pulse light from the seed light source", in which the optical switching element 40 is OFF due to the control performed by the control unit 100, in the output permitted state is not necessarily the entire period including all the periods between the output periods of the plurality of pulse light beams, that is, periods without the pulse light, and may be a part of such periods as long as the energy in the active region of the solid state amplifier, as a result of the excitation by the excitation light source, is not largely consumed for the ASE noise.

The "output period of the pulse light from the seed light source", in which the optical switching element 40 is OFF due to the control performed by the control unit 100, in the output stopped state is not necessarily the entire period during which the pulse light is output from the seed light source, and may be a part of such an entire period as long as the pulse light as a result of the wavelength conversion by the nonlinear optical element is weak, and includes small periods before and after the period during which the pulse light is output from the seed light source.

The "period other than the output period of the pulse light from the seed light source", in which the optical switching element 40 is ON due to the control performed by the control unit 100, in the output stopped state is not necessarily an entire period between the output periods of the plurality of pulse light beams, that is, periods without the pulse light, and may be a part of such a period as long as the excessively excited state of the solid state amplifier can be canceled by the ASE noise. Furthermore, the period may not include all the periods between a plurality of pulse light output periods, and may be one such a period in every predetermined number of pulse light output periods.

Figure 4:
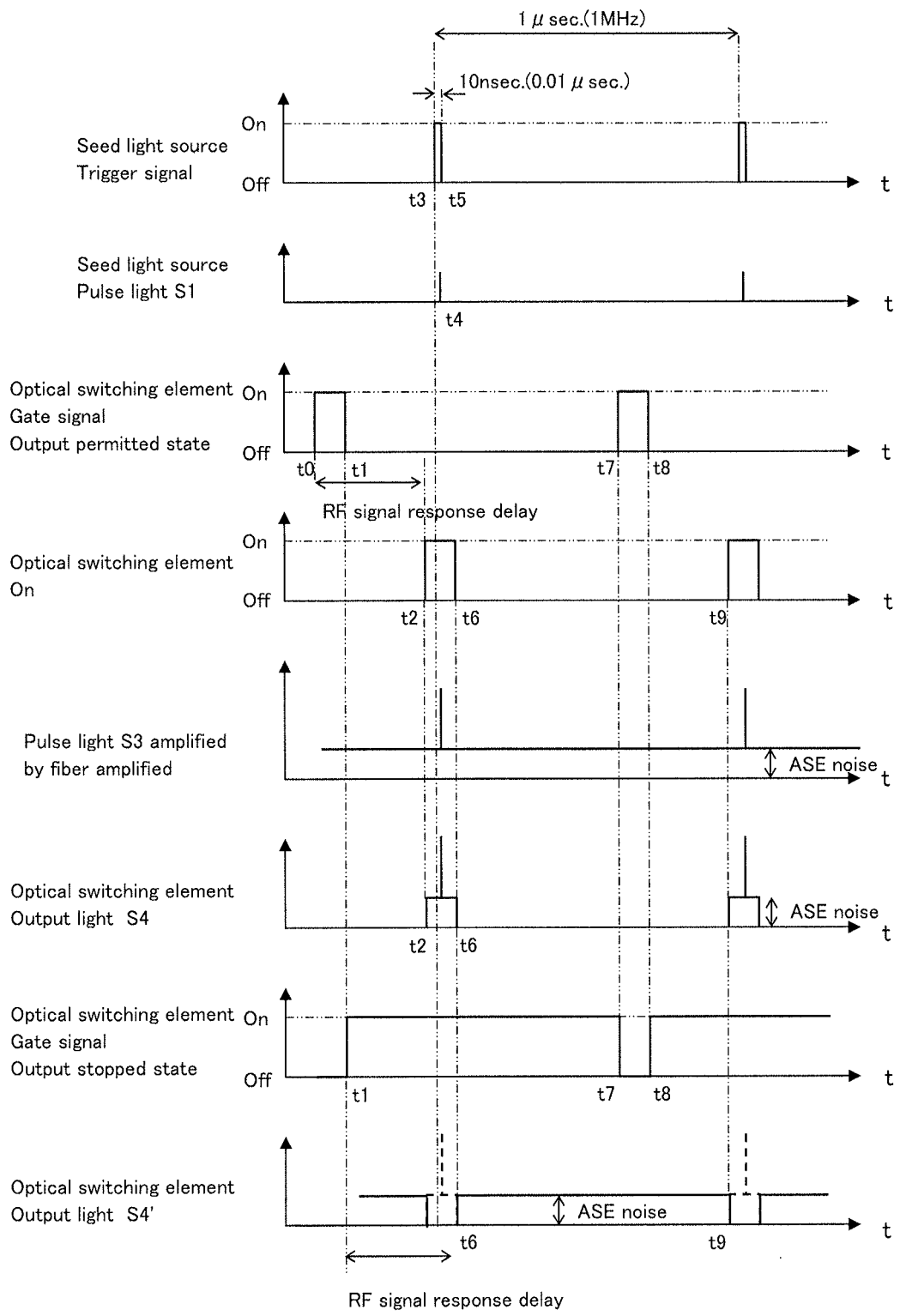
FIG. 4 is a timing chart illustrating timings for outputting a trigger signal for driving the seed light source and a gate signal for driving the optical switching element, in accordance with optical pulse output stopped and permitted states.

FIG. 4 is a timing chart illustrating control performed by the control unit 100 on the seed light source 10 and the optical switching element 40.

In the output permitted state, the gate signal is output to the RF driver D2 of the optical switching element 40 at a reference time point t0, and after a predetermined time delay, the trigger signal is turned ON and output to the driver D1 of the seed light source 10 at a time point t3. At a time point t4, the relaxation oscillation occurs, and the trigger signal is turned OFF at a predetermined time point t5 after the time point t4. Thus, pulse light S1 having a predetermined pulse width is obtained, and pulse light S3 as a result of the amplification by the fiber amplifiers 20 and 30 is obtained. The pulse light S3 has an increased bandwidth and the ASE noise superimposed thereon.

A configuration where at the predetermined time point t5, the driver D1 causes the seed light source 10, in which the relaxation oscillation has occurred, to stop the laser emission may be employed instead of the configuration in which the control unit 100 turns OFF the trigger signal at the time point t5 to stop the laser emission. In such a case, the trigger signal may be turned OFF at any timing.

The optical switching element 40 is turned ON at the time point t2 by the gate signal, turned ON and output at the time point t0, and is turned OFF at the time point t6 by the gate signal turned OFF at the time point t1. Output S4, which has been amplified by the fiber amplifier 30 and has passed through the optical switching element 40, is propagated to the solid state amplifier 50 within a period between the time points t2 and t6 during which the optical switching element 40 is ON.

In other words, the output light S4, which has been amplified by the fiber amplifier 30 and has passed through the optical switching element 40, that is, pulse light S4 output from the seed light source 10 is propagated to the solid state amplifier 50 within the period between the time points t2 and t6 during which the optical switching element 40 is ON. The ASE noise is prevented from propagating to the solid state amplifier 50 in a period between the time points t6 to t9 during which the optical switching element 40 is OFF. Thus, the excitation energy accumulated in the active region of the solid state amplifier 50 is prevented from being wastefully consumed.

In the output stopped state, the gate signal is output to the RF driver D2 of the optical switching element 40 at a reference time point t1, and after a predetermined time delay, the trigger signal is turned ON and output to the driver D1 of the seed light source 10 at the time point t3. At the time point t4, the relaxation oscillation occurs, and the trigger signal is turned OFF at the predetermined time point t5 after the time point t4. Thus, pulse light S1 having a predetermined pulse width is obtained, and pulse light S3 as a result of the amplification by the fiber amplifiers 20 and 30 is obtained. The pulse light S3 has an increased bandwidth and the ASE noise superimposed thereon.

The optical switching element 40 is turned ON at the time point t6 by the gate signal, turned ON and output at the time point t1, and is turned OFF at the time point t9 by the gate signal turned OFF at the time point t7. Output light S4', which has been amplified by the fiber amplifier 30 and has passed through the optical switching element 40, is propagated to the solid state amplifier 50 within a period between the time points t6 and t9 during which the optical switching element 40 is ON.

Here, the pulse light is not input but the ASE noise is input to the solid state amplifier 50. Thus, the excitation energy accumulated in the active region of the solid state amplifier 50 is discharged by the ASE noise, whereby the giant pulse is prevented from being generated when the output permitted state is achieved thereafter.

In the example described with reference to FIG. 4, the gate signal for the optical switching element 40 in the output permitted state has a phase shifted by 180° from that of the gate signal in the output stopped state. Thus, the On state and the OFF state of the optical switching element 40 in the output stopped state are basically in an inverted relationship.

In FIG. 4, the ON state illustrated represents a state where the diffraction grating is formed in the optical switching element 40 due to the RF signal input, and thus the diffracted light propagates to the solid state amplifier 50. The OFF state illustrated represents a state where no diffraction grating is formed in the optical switching element 40, so that no light propagates to the solid state amplifier 50, and zero order light is attenuated by the damper. The control signal output to the optical switching element 40 may be a positive logic signal or may be a negative logic signal.

In the example described above, the optical switching element 40 is ON in the entire period between each two of the output periods for a plurality of pulse light beams repeatedly output from the seed light source 10 in the output stopped state. Alternatively, a configuration may be employed in which the optical switching element 40 is ON in a part of the period between each two of the output periods for a plurality of pulse light beams repeatedly output from the seed light source 10, as long as the excitation energy accumulated in the active region of the solid state amplifier 50 can be sufficiently discharged by the ASE noise.

Furthermore, a configuration may be employed in which the optical switching element 40 is repeatedly turned ON and OFF in the period between each two of the output periods for a plurality of pulse light beams repeatedly output from the seed light source 10. With such control, heat emitted from the AOM of the optical switching element 40 can be reduced.

The ASE noise is preferably removed as much as possible in the ON period of the optical switching element 40 in the output permitted state. Thus, the ON period is set to be preferably in a range from 1.5 to 10 times, and more preferably in a range from 1.5 to 3 times the pulse width of the pulse light output from the seed light source 10. For example, when the pulse width of the pulse light output from the seed light source 10 is 50 picoseconds, the ON period is set to be in a range from 75 picoseconds to 500 picoseconds. The range of the ON period might be limited by the control cycle of the control unit 100.

Preferably, the OFF time of the optical switching element 40 in the output stopped state is set in such a manner that the propagation of the pulse light output from the seed light source 10 is substantially completely prevented, and is sufficiently shorter than a pulse period. Thus, the OFF time of the switching element 40 may be set to be 2 to 10 times, preferably 2 to 5 times the pulse width of the pulse light.

Thus, the ON time of the optical switching element in the output permitted state is preferably set to be shorter than the OFF time of the optical switching element 40 in the output stopped state.

In the example illustrated in FIG. 4, the control unit 100 is configured to output the trigger signal to control the seed light source 10, based on the control signal (gate signal) for the optical switching element 40. In such a configuration, the optical switching element 40 can be appropriately driven with the control signal for controlling the seed light source 10 generated based on the control signal for the optical switching element 40, even when the response of the optical switching element 40 is slower than that of the pulse light output from the seed light source 10.

It is a matter of course that the optical switching element 40 can be controlled based on the control signal for the seed light source 10 when the response of the optical switching element 40 is sufficiently faster than that of the pulse light output from the seed light source 10.

All things considered, the control unit 100 described above executes a laser pulse light generating method including controlling, when the output of the pulse light from the nonlinear optical elements 60 and 70 is stopped, the optical switching element 40 disposed between the fiber amplifier 30 and the solid state amplifier 50 in such a manner that propagation of light is stopped in the output period of the pulse light from the seed light source 10, and permitted in a period other than the output period of the pulse light from the seed light source 10.

Similarly, the control unit 100 described above executes a laser pulse light generating method including controlling, when the output of the pulse light from the nonlinear optical elements 60 and 70 is permitted, the optical switching element 40 in such a manner that light is permitted to propagate in the output period of the pulse light from the seed light source 10, and stopped in a period other than the output period of the pulse light from the seed light source 10.

Figure 5A:
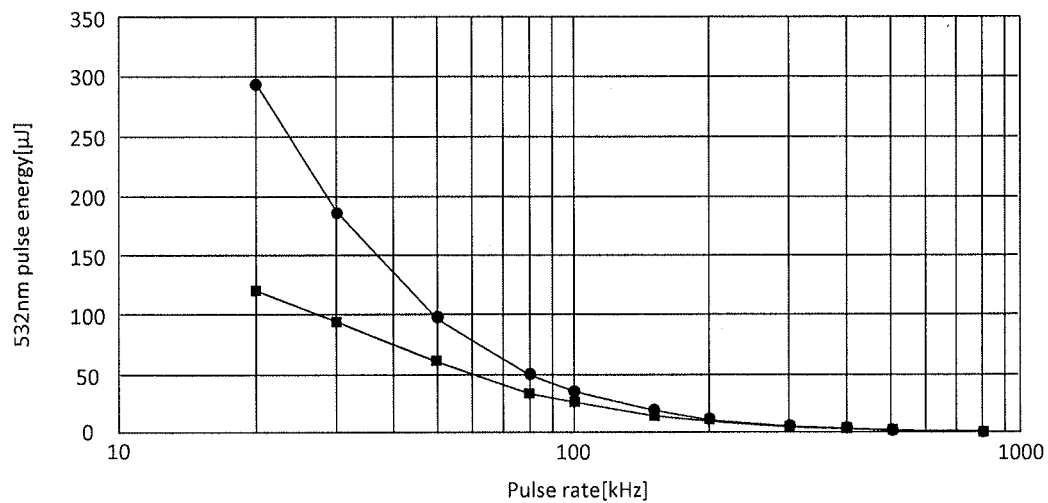
FIG. 5A is a diagram illustrating a comparison between a case where the optical switching element is used and a case where the optical switching element is not used in pulse energy characteristics after wavelength conversion.
Figure 5B:
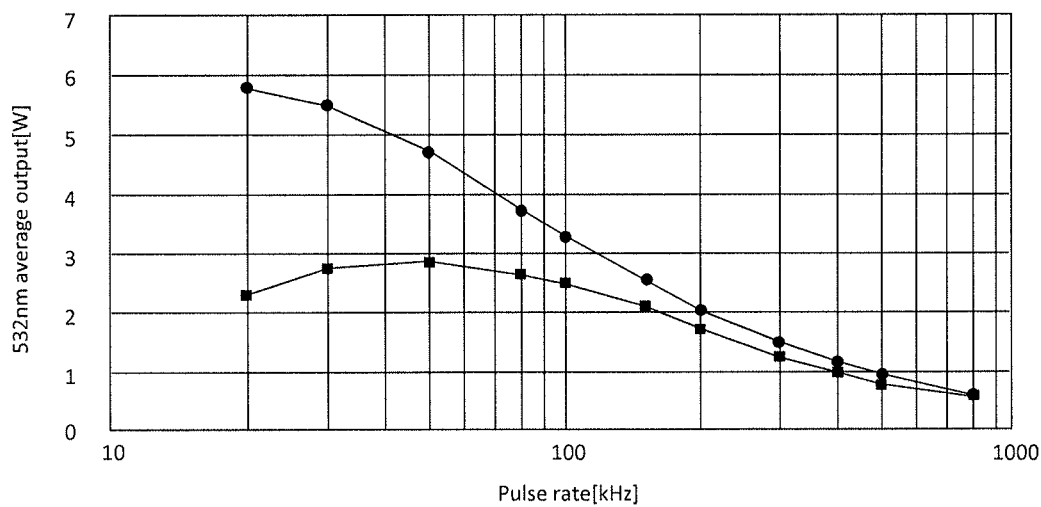
FIG. 5B is a diagram illustrating a comparison between the case where the optical switching element is used and the case where the optical switching element is not used in average power characteristics after the wavelength conversion.

FIG. 5A illustrates pulse energy characteristics after the wave conversion in a case where an optical switching element is used that removes the ASE noise in a state where power at the time of driving the excitation light sources 21, 31, and 51 is maintained at a constant level and a case where the optical switching element is not used. FIG. 5B illustrates average power characteristics after the wave conversion in the case where the optical switching element that removes the ASE noise is used and the case where the optical switching element is not used. In both figures, the characteristics plotted by black circles represent the case where the optical switching element is used, and the characteristics plotted by black squares represent the case where the optical switching element is not used.

It can be seen in FIG. 5A and FIG. 5B that the pulse energy and the average power effectively increase in a frequency range from several tens of kilohertz to several megahertz, when the ASE noise is removed by using the optical switching element.

The present invention can be widely applied to laser light-source apparatuses that uses a seed light source that is driven by a frequency of several hundreds of megahertz or lower and a pulse width of several hundreds of picoseconds or shorter, as semiconductor lasers including a DFB laser.

Another embodiment of the present invention is described below.

A bandpass filter may be further provided on the downstream side of the fiber amplifiers 20 and 30 in the embodiment described above. The bandpass filter reduces the bandwidth of pulse light having an increased bandwidth due to chirping effect, self-phase modulation and Raman scattering in an optical fiber, or the like.

Figure 6:
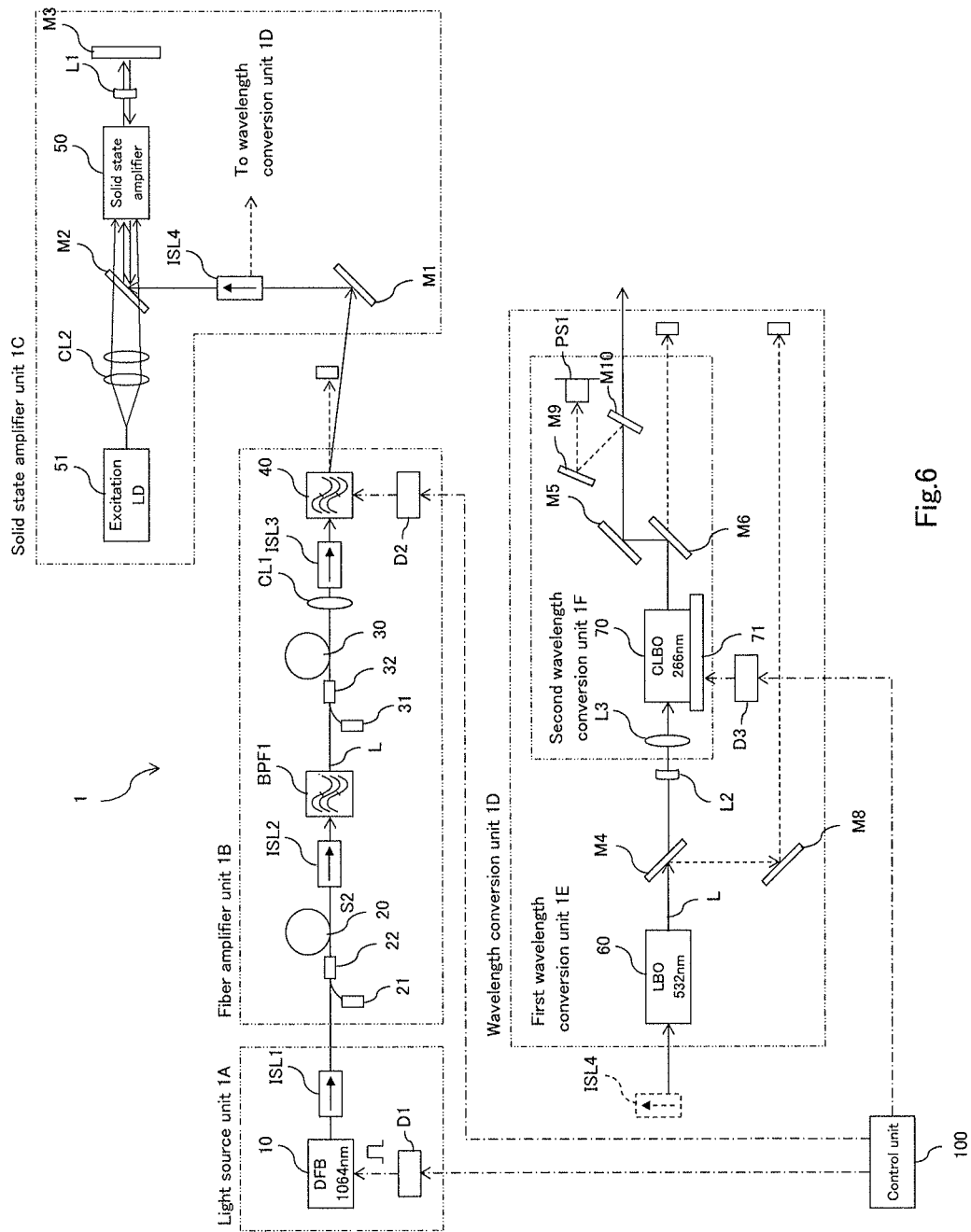
FIG. 6 is a block diagram illustrating a configuration of a laser light-source apparatus according to another embodiment.

FIG. 6 illustrates an example where a bandpass filter BPF1 is provided on a downstream side of the fiber amplifier 20. The pulse light that has had a bandwidth increased while being amplified by the fiber amplifier 20 and has the ASE noise superimposed thereon is filtered by the bandpass filter BPF1. As a result, pulse light with a bandwidth narrowed by a certain level and the ASE noise removed is obtained and input to the fiber amplifier 30 on the downstream stage.

A bandpass filter may also be provided between the seed light source 10 and the optical isolator ISL1 and between the optical isolator ISL1 and the fiber amplifier 20 to prevent the ASE noise from being reflected to the seed light source.

In the embodiment described above, an example is described where the acousto-optic element that turns ON or OFF the primary diffracted light in accordance with the turning ON or OFF of the ultrasound transducer is used as the optical switching element 40. Alternatively, an electro-optic element that turns ON and OFF light with an electric field in accordance with intensity modulation through EO modulation may be used as the optical switching element 40.

An extremely small rocking mirror, made by a micromachining technique (a mirror including Micro Electro Mechanical Systems (MEMS)), may be used as the optical switching element 40. Here, the propagation of the output from the fiber amplifier 30 to the solid state amplifier 50 may be permitted or stopped by switching a rocking angle of the extremely small rocking mirror. Furthermore, a polarization device that can control transmission and blocking of light by dynamically switching a polarization state may be used. In other words, the optical switching element may include a dynamic optical element.

In the embodiment described above, the configuration is described in which the gate signal, for the optical switching element 40, controlled by the control unit 100 has the phase shifted by 180° between the output permitted state and the output stopped state. However, this should not be construed as a limiting sense. The gate signal may be output in any manner as long as the propagation of light is stopped at an output timing of the pulse light from the seed light source 10, and permitted at a timing different from the output timing, at least in the output stopped state in which the output of the pulse light from the nonlinear optical elements 60 and 70 is stopped.

Figure 7A:
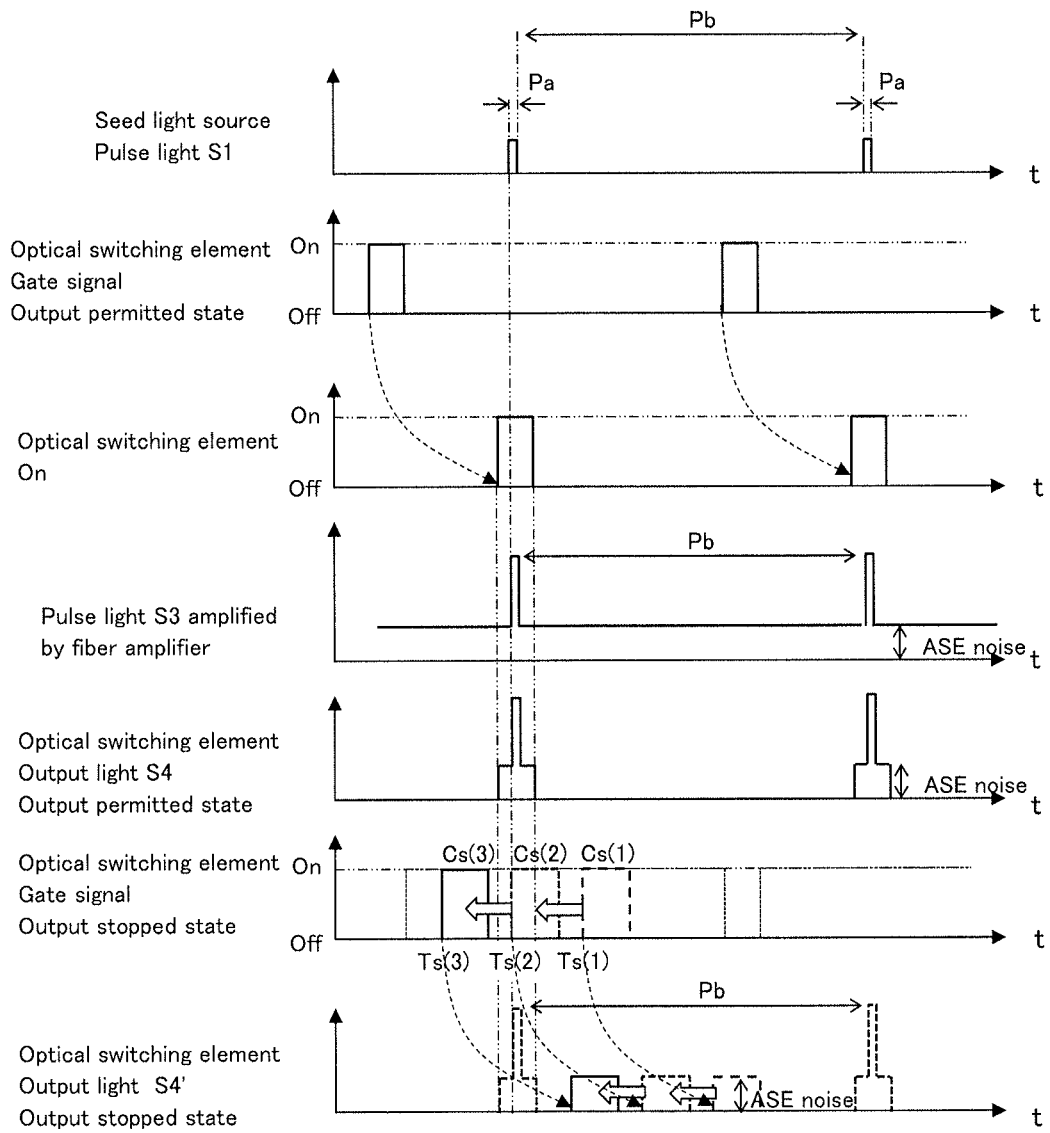
FIG. 7A is a timing chart illustrating timings for outputting the trigger signal for driving the seed light source and the gate signal for driving the optical switching element, in accordance with the optical pulse output stopped and permitted states of the laser light-source apparatus according to another embodiment.

For example, as illustrated in FIG. 7A, the transition from the output stopped state to the output permitted state may be achieved with the control unit 100 shifting an output timing Ts of a control signal Cs for controlling the optical switching element 40 in a stepwise or continuous manner so that the propagation of light is permitted in a period Pb between output periods Pa of the plurality of pulse light beams repeatedly output from the seed light source 10, that is, in a period with no pulse light. For example, the timing may be shifted in a stepwise or continuous manner based on a timing of the previous output timing or an output timing few times before the current output timing.

In the output stopped state, when output timings Ts(1), Ts(2), Ts(3), . . . of control signals Cs(1), Cs(2), Cs(3), . . . , for controlling the optical switching element 40, are shifted in a stepwise or continuous manner in an advancing or delaying direction so that the propagation of light is permitted in the period other than the output period of the pulse light output from the seed light source 10, the timing eventually overlaps with an output period Pa of the pulse light output from the seed light source 10, whereby the output permitted state is achieved. The control signals Cs(1), Cs(2), and Cs(3) are respectively illustrated with a dashed line with a large pitch, a dashed line with a short pitch, and a solid line so that their change along the output timings Ts(1), Ts(2), and Ts(3) can be clearly recognized.

Figure 7B:
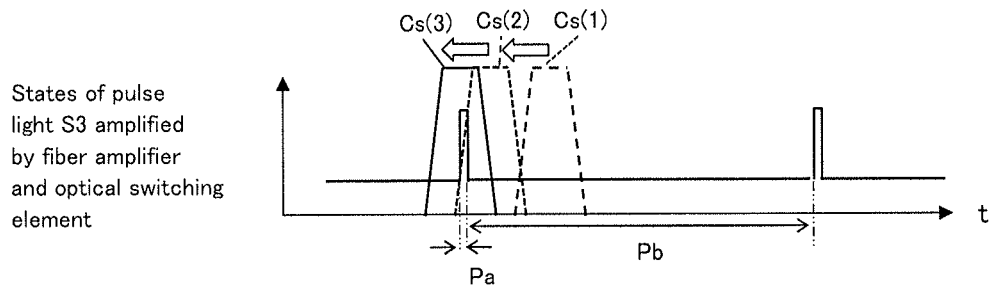
FIG. 7B is a timing chart illustrating timings for outputting the trigger signal for driving the seed light source and the gate signal for driving the optical switching element, in accordance with the optical pulse output stopped and permitted states of the laser light-source apparatus according the other embodiment.

As illustrated in FIG. 7B, in a transitioning state involving the transition from the output stopped state to the output permitted state, the output period Pa of the pulse light output from the seed light source 10 overlaps with a transitioning timing for the optical switching element 40 to transition to the ON state, and then an appropriate ON state is achieved. For example, when the AOM is used as the optical switching element 40, the energy of the pulse light propagating to the solid state amplifier 50 through the optical switching element 40 is extremely small at an initial point with a low diffraction efficiency, and then increases as the diffraction efficiency increases. Thus, even when the excessive population inversion state of the active region of the solid state amplifier 50 has been achieved, such energy in the active region is consumed for amplifying the pulse light with the extremely small energy at the initial point, whereby no giant pulse is produced.

In FIG. 7B, the periods are illustrated in a trapezoidal shape reflecting a transitioning state where the diffraction efficiency gradually rises to a certain saturation level after the ON signal has been input to the optical switching element 40, and a transitioning state where the diffraction efficiency gradually drops after the OFF signal is then input to the optical switching element 40.

Thus, when the output period Pa of the pulse light overlaps with the rising timing of the optical switching element 40 at the initial point (see Cs(2) in FIG. 7B), the energy of the pulse light entering the solid state amplifier 50 is small because the diffraction efficiency of the optical switching element 40 is low. Then, the input timing of the ON signal to the optical switching element 40 becomes early with respect to the next pulse light. Thus, at a timing where overlapping with the saturated state of the optical switching element occurs, the diffraction efficiency of the optical switching element 40 is stably at a high value. All things considered, the energy of the pulse light entering the solid state amplifier 50 does not largely attenuate.

When the response of the optical switching element 40 is sufficiently fast, the pulse width of the light pulse propagating to the solid state amplifier 50 through the optical switching element 40 is extremely short at the initial point, and then gradually increases. Thus, even when the excessive population inversion state of the active region of the solid state amplifier 50 has been achieved, such energy in the active region is consumed for amplifying the light pulse with the extremely short pulse width at the initial point, whereby no giant pulse is produced.

In the embodiment described above, an example is described where the excitation light source of each of the light amplifiers 20, 30, and 50 is constantly driven. Alternatively, the excitation light sources 21, 31, and 51 of each of the fiber amplifiers 20 and 30 and/or the solid state amplifier 50 may be periodically or intermittently controlled by the control unit 100, in such a manner that the fiber amplifiers 20 and 30 and/or the solid state amplifier 50 enters the population inversion state at least before receiving the pulse light output from the seed light source 10.

For example, periodical ON/OFF control or intensity modulation control may be performed in such a manner that the light amplifier enters the population inversion state at the timing of receiving the pulse light output from the seed light source 10. Preferably, the excitation light sources 21, 31, and 51 are driven at a timing that is earlier than the timing of the trigger signal for driving the seed light source 10 by a period that is 0.5 to 3 times a fluorescent lifetime τ of the light amplifier. The excitation light source may be intermittently driven during such a period so that the light amplifier enters the population inversion state.

With the excitation light sources 21, 31, and 51 thus controlled, the excitation light is periodically or intermittently driven so that the fiber amplifiers 20 and 30 and/or the solid state amplifier 50 enters the population inversion state before receiving the pulse light output from the seed light source 10. Thus, wasteful energy consumption not contributing to the amplification of pulse light as well as heat emission can be reduced.

In the embodiment described above, an example is described where the control unit 100 is provided that controls the optical switching element 40 in such a manner that the propagation of light is permitted at an output timing of the pulse light from the seed light source 10 and stopped at a timing other than the output timing, when the output of the pulse light from the nonlinear optical element is permitted. The control unit 100 of the laser light-source apparatus according to the present invention may have any configuration as long as the optical switching element 40 is controlled at least in such a manner that the propagation of light is stopped at the output timing of the pulse light from the seed light source 10 and permitted at the timing other than the output timing, in a state where the output of the pulse light from the nonlinear optical element is stopped.

In the embodiment described above, an example is described where the DFB laser is used as the seed light source and employs the gain switching to generate single longitudinal mode pulse light having a higher intensity than in a normal state. In the present invention, any semiconductor laser may be used as the seed light source, and thus a general Fabry-Perot semiconductor laser other than the DFB laser may be used.

The present invention is not limited to the seed light source with an oscillation wavelength of 1064 nm. For example, seed light sources with different wavelengths, such as 1030 nm, 1550 nm, and 976 nm, may be selected as appropriate for different applications. Furthermore, these wavelengths may be used as the fundamental waves to generate harmonics, sum frequencies, and difference frequencies through the nonlinear optical element. A nonlinear optical element different from that described above may be used. For example, a BBO crystal, a KBBF crystal, an SBBO crystal, a KABO crystal, a BABO crystal, or the like may be used instead of the CLBO crystal.

Each of the plurality of embodiments described above is described as one embodiment of the present invention, and the scope of the present invention is not limited by the description. It is a matter of course that the specific circuit configurations of each component and optical elements used for circuits may be selected as appropriate or designed differently as long as the effects of the present invention are obtained.

DESCRIPTION OF SYMBOLS

1: Laser light-source apparatus
10: Seed light source
20,30: Fiber amplifier
40: Optical switching element
50: Solid state amplifier
60,70: Nonlinear optical element

The invention claimed is:

1. A laser light-source apparatus comprising:
a seed light source configured to output pulse light based on gain switching;
a fiber amplifier configured to amplify the pulse light output from the seed light source;
a solid state amplifier configured to amplify the pulse light output from the fiber amplifier;
a nonlinear optical element configured to perform wavelength conversion on the pulse light output from the solid state amplifier and output the resultant pulse light;
an optical switching element that is disposed between the fiber amplifier and the solid state amplifier, and is configured to permit or stop propagation of light from the fiber amplifier to the solid state amplifier; and
a control unit configured to control the optical switching element in such a manner that the propagation of the light is stopped in an output period of the pulse light from the seed light source, and permitted in a period other than the output period of the pulse light from the seed light source to achieve an output stopped state in which the output of the pulse light from the nonlinear optical element is stopped.

2. The laser light-source apparatus according to claim 1, wherein the control unit is configured to periodically or intermittently control an excitation light source of the fiber amplifier and/or the solid state amplifier in such a manner that the fiber amplifier and/or the solid state amplifier enters a population inversion state at least before receiving the pulse light output from the seed light source.

3. The laser light-source apparatus according to claim 2, wherein
the seed light source includes a DFB laser, and
the control unit is configured to drive the DFB laser with a frequency of several megahertz or lower and a pulse width of several hundreds of picoseconds or shorter.

4. The laser light-source apparatus according to claim 1, wherein the control unit is configured to control the optical switching element in such a manner that the propagation of the light is permitted in the output period of the pulse light from the seed light source, and stopped in the period other than the output period of the pulse light from the seed light source to achieve an output permitted state in which the output of the pulse light from the nonlinear optical element is permitted.

5. The laser light-source apparatus according to claim 4, wherein the control unit is configured to shift in a stepwise or continuous manner, an output timing of a control signal for controlling the optical switching element in such a manner that the propagation of the light is permitted so that the output stopped state transitions to the output permitted state, in a period between output periods of a plurality of pulse light beams repeatedly output from the seed light source.

6. The laser light-source apparatus according to claim 5, wherein
the seed light source includes a DFB laser, and
the control unit is configured to drive the DFB laser with a frequency of several megahertz or lower and a pulse width of several hundreds of picoseconds or shorter.

7. The laser light-source apparatus according to claim 4, wherein
the seed light source includes a DFB laser, and
the control unit is configured to drive the DFB laser with a frequency of several megahertz or lower and a pulse width of several hundreds of picoseconds or shorter.

8. The laser light-source apparatus according to of claim 1, wherein the optical switching element includes a dynamic optical element including an acousto-optic element or an electro-optic element.

9. The laser light-source apparatus according to claim 8, wherein the control unit is configured to control the seed light source based on a control signal for the optical switching element.

10. The laser light-source apparatus according to claim 9, wherein
the seed light source includes a DFB laser, and
the control unit is configured to drive the DFB laser with a frequency of several megahertz or lower and a pulse width of several hundreds of picoseconds or shorter.

11. The laser light-source apparatus according to claim 8, wherein
the seed light source includes a DFB laser, and
the control unit is configured to drive the DFB laser with a frequency of several megahertz or lower and a pulse width of several hundreds of picoseconds or shorter.

12. The laser light-source apparatus according to claim 1, wherein
the seed light source includes a DFB laser, and
the control unit is configured to drive the DFB laser with a frequency of several megahertz or lower and a pulse width of several hundreds of picoseconds or shorter.

13. A laser pulse light generating method in which pulse light output from a seed light source based on gain switching is sequentially amplified by a fiber amplifier and a solid state amplifier, subjected to wavelength conversion by a nonlinear optical element, and then is output, the method comprising controlling, when the output of the pulse light from the nonlinear optical element is stopped, an optical switching element disposed between the fiber amplifier and the solid state amplifier in such a manner that propagation of light is stopped in an output period of the pulse light from the seed light source, and permitted in a period other than the output period of the pulse light from the seed light source.

14. The laser pulse light generating method according to claim 13, wherein when the output of the pulse light from the nonlinear optical element is permitted, the optical switching element is controlled in such a manner that the propagation of light is permitted in the output period of the pulse light from the seed light source, and stopped in a period other than the output period of the pulse light from the seed light source.

* * * * *